United States Patent [19]
van Sluys

[11] 3,818,362
[45] June 18, 1974

[54] NOISE REDUCTION CIRCUIT

[75] Inventor: Robert Nestor Joseph van Sluys, Emmasingel, Eindhoven, Netherlands

[73] Assignee: U.S. Philips Corporation, New York, N.Y.

[22] Filed: Apr. 25, 1972

[21] Appl. No.: 247,264

[30] Foreign Application Priority Data

May 4, 1971 Netherlands ........................ 7106040

[52] U.S. Cl. ................ 330/30 R, 328/167, 330/126, 330/149, 330/151
[51] Int. Cl. ................................................ H03f 3/68
[58] Field of Search .......... 330/126, 30 R, 151, 149; 328/167; 179/1 P, 100.2 K

[56] References Cited

UNITED STATES PATENTS

| | | | |
|---|---|---|---|
| 3,270,213 | 8/1966 | Brault | 328/167 X |
| 3,548,334 | 12/1970 | Tomita et al. | 330/126 X |
| 3,631,365 | 12/1971 | Dolby | 179/100.2 K |
| 3,665,345 | 5/1972 | Dolby | 330/151 X |

FOREIGN PATENTS OR APPLICATIONS

| | | | |
|---|---|---|---|
| 1,111,863 | 5/1968 | Great Britain | 328/167 |
| 1,120,541 | 7/1968 | Great Britain | 179/100.2 K |

*Primary Examiner*—Herman Karl Saalbach
*Assistant Examiner*—James B. Mullins
*Attorney, Agent, or Firm*—Frank R. Trifari; Henry I. Steckler

[57] ABSTRACT

Noise reduction circuit in which the signal is applied to an adding circuit via two signal paths. The first signal path comprises a high-pass filter and an automatic gain control which is designed so that signals having an amplitude exceeding a given threshold value are strongly attenuated. The second signal path includes an all-pass filter. The gain and the phase shift in each signal path are such that corresponding signals cancel one another at the inputs of the addition circuit. The all-pass filter and the high-pass filter are selected to have transfer characteristics such that the overall transfer function has a maximum-flatness characteristic in the pass band.

8 Claims, 6 Drawing Figures

NOISE REDUCTION CIRCUIT

Figure 1:
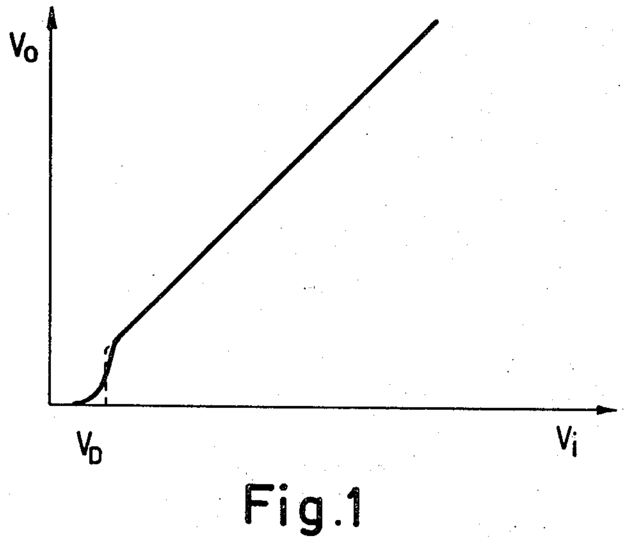

The invention relates to a noise reduction circuit which comprises an input stage to which the signal to be processed is applied and which has a first and a second output, an all-pass filter connected to the first output of the input stage, a high-pass filter connected to the second output of the input stage, an automatic gain control the input of which is connected to the output of the high-pass filter and the gain of which, above a given threshold value of the signal at its input, decreases with increasing amplitude of this signal, and an adding circuit the first input of which is connected to the all-pass filter and the second input of which is connected to the output of the automatic gain control, the common signals which have amplitudes lower than the said threshold value at the two inputs of the adding circuit being at least substantially equal in amplitude and opposite in phase.

Such a circuit is of particular importance in playing back magnetically recorded audio programs in which inter alia owing to the tape noise a comparatively strong background noise occurs, especially in the upper frequency band. It is known that a masking effect of this noise is produced if high-level signals having frequencies in this frequency band are present. Hence there is a need for a circuit which greatly suppresses signals which have a frequency in the said frequency band and an amplitude smaller than a given threshold value, whilst signals having an amplitude greater than this threshold value must be transmitted without attenuation. Further it is of importance that the noise reduction circuit is not influenced by low frequency signals, because otherwise a noise modulation effect is produced, which may be even more annoying than is continuous noise. Hence the noise reduction must in addition to an amplitude-dependent nature have a frequency-dependent nature also such that only the amplitude level of the signals having a frequency in the upper frequency band determines the behaviour of the noise reduction circuit.

In noise reduction circuits of the type described at the beginning of this specification the desired noise reduction is achieved in the following manner. The threshold value of the automatic gain control is selected to be, for example, equal to the expected maximum amplitude of the high-frequency noise. The output signal of the high-pass filter, which signal consequently contains the high-frequency noise, is applied to the automatic gain control. When the amplitude of this signal applied to the automatic gain control is smaller than the threshold value, this signal is amplified by a factor such that the output signal of the automatic gain control applied to the second input of the adding circuit has an amplitude equal to the amplitude of the corresponding high-frequency part of the signal at the first input of the adding circuit, which latter signal is applied via the all-pass filter. However, these two signals at the two inputs of the adding circuit are in phase opposition, with the result that in the output signal of the adding circuit the high frequency part of the input signal and hence the high frequency noise, is completely absent.

When the amplitude of the output signal of the high pass filter is greater than the chosen threshold value of the automatic gain control the gain of the automatic gain control decreases. Assuming the gain to have decreased in a degree such that the output signal of the automatic gain control is negligible with respect to the corresponding high-frequency part of the signal applied to the noise reduction circuit, this high-frequency signal will appear unattenuated at the output of the addition circuit, for now a signal is applied to the adding circuit via the all-pass filter only.

In a noise reduction circuit based on the aforementioned principle it is of importance that the automatic gain control has a well-defined threshold value, i.e., that the gain rapidly decreases for amplitudes exceeding this threshold value. Further this automatic gain control must respond only the signals having frequencies in the upper frequency band of the audio range, so that a high-pass filter having a steep edge is desirable. Finally, for the lower frequencies an overall frequency characteristic which is as flat as possible is obviously desired.

It is an object of the invention to provide a noise reduction circuit which largely satisfies the aforementioned requirements and at the same time may be structurally simple.

The invention is characterized in that the all-pass filter has a transfer function which at least substantially corresponds to the function $1-p\,\tau/1+p\,\tau$ and that the high-pass filter has a transfer function which at least substantially corresponds to the function $$(p\,\tau)^3/(p\,\tau+1)\{(p\,\tau)^2+p\,\tau+1\}$$

where $p$ is the imaginary angular frequency and $\tau$ is a time constant.

The particular choice of the frequency characteristics of the all-pass and high-pass filters firstly ensures that the overall transfer function corresponds to that of a third-order low-pass filter having a "Butterworth" or "maximum flat" characteristic in the pass band. Further the all-pass filter gives to a 180° phase lag for the high frequencies. A benificial consequence thereof is that the phase leads due to the correction networks included in the magnetic tape recorder is largely compensated for, with the result that the transient reproduction is markedly improved.

Figure 2A:
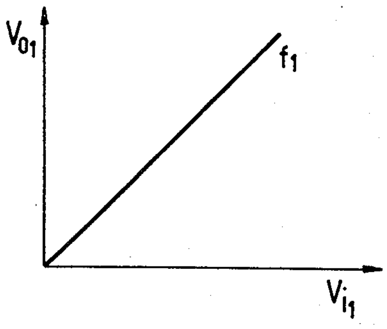
Figure 2B:
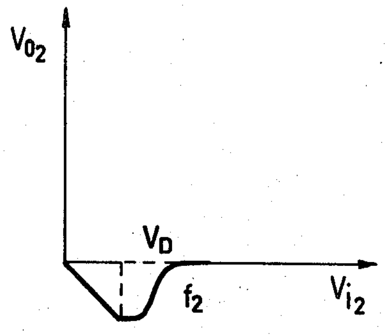
Figure 3:
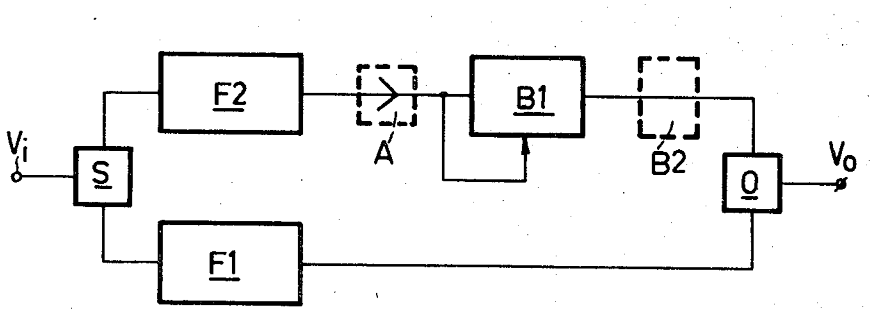
Figure 4:
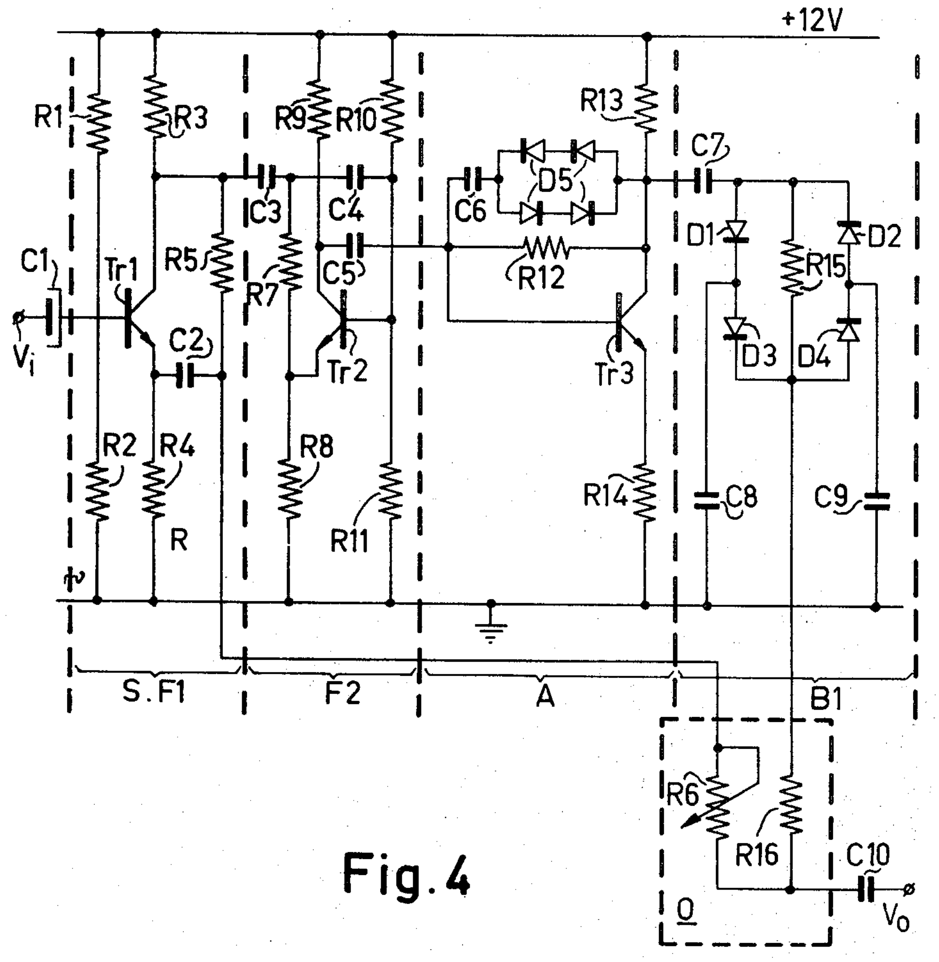
Figure 5:
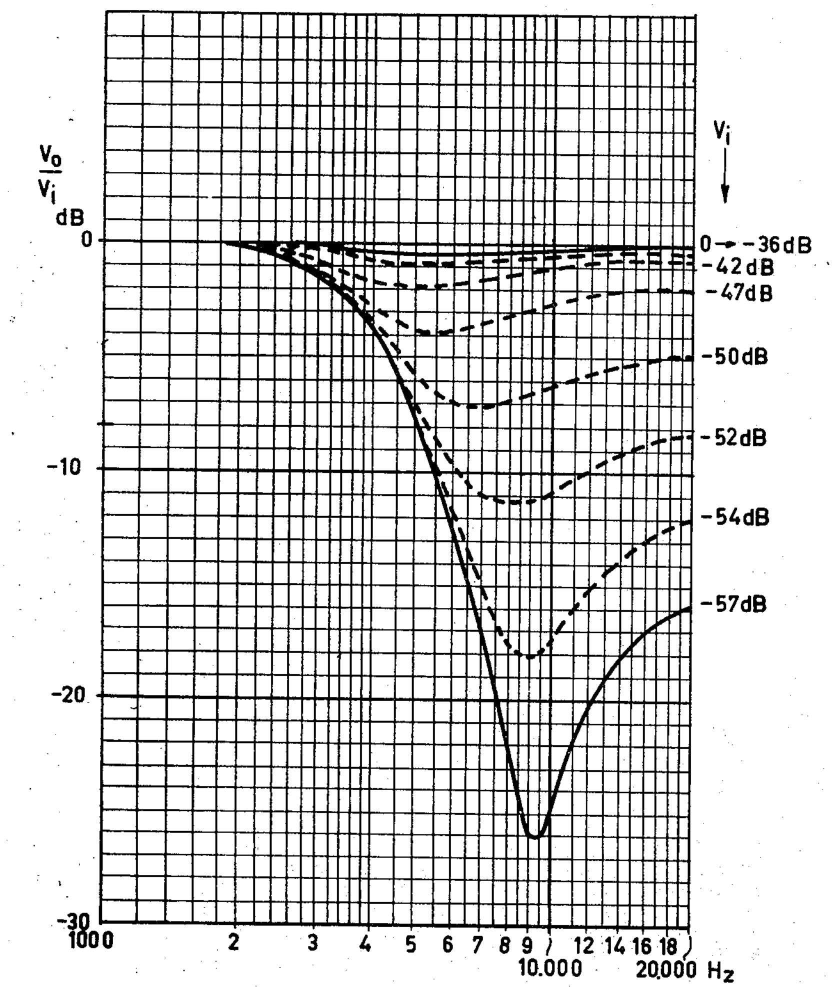

Possible embodiments of the filters and of the automatic gain control according to the invention will now be described, by way of example, with reference to the accompanying diagrammatic drawings, in which:

FIG. 1 shows the desired amplitude characteristic for frequencies in the upper frequency band, FIG. 2*a* and 2*b* show the partial characteristics which enable the desired characteristic to be realized, FIG. 3 is a block diagram and FIG. 4 is a more elaborate circuit diagram of an embodiment of the noise reduction circuit according to the invention, and FIG. 5 shows the overall transfer characteristic of the circuit shown in FIG. 1 as a function of the value of the input voltage.

FIG. 1 shows the desired amplitude characteristic for frequencies in the upper frequency band of the audio range. Assuming the maximum amplitude of the high-frequency noise to be $V_D$, it is desired that for input signals having an amplitude smaller than this threshold value $V_D$ the output signal $V_o$ is zero so that this noise is completely suppressed. For input signals having an amplitude greater than $V_D$ a gain of, for example, unity is desired. The high-frequency noise is still present, but is no longer troublesome owing to the aforementioned masking effect. Owing to physical limitations the characteristic actually obtained in the transition region will not be that indicated by the broken line but that indicated by the solid line.

FIGS. 2*a* and 2*b* indicate how the characteristic shown in FIG. 1 may be considered to be composed of two characteristics *f*1 and *f*2. The input signal $V_i$ is divided in two identical signals $V_{i1}$ and $V_{i2}$. The signal $V_{i1}$ is directly, i.e., with unity gain, transmitted to an addition circuit. The signal $V_{i2}$ is applied to a circuit which for amplitudes smaller than $V_D$ has unity gain and for amplitudes greater than $V_D$ has zero gain. Owing to physical limitations in this circuit also the transition indicated by the solid line will be obtained. Applying the signal $V_{o2}$ to the adding circuit with a phase opposite to that with which the signal $V_{o1}$ is applied thereto results in an overall characteristic corresponding to that shown in FIG. 1.

FIG. 3 shows a block diagram of the noise reduction circuit according to the invention. The input signal $V_i$ is applied to an input stage S which splits up the input signal in two signals of equal amplitude which pass through two separate branches. One of the signals is applied to an adding circuit O via an all-pass filter F1. The second signal is applied to the same adding circuit via the series connection of a high-pass filter F2 and an automatic gain control B1. This automatic gain control has an amplitude characteristic corresponding to that shown in FIG. 2*b*. Owing to the preceding high-pass filter this characteristic plays a part only in respect of frequencies in the upper frequency band. Signals in this frequency band having an amplitude smaller than the threshold value $V_D$ consequently are transmitted by this automatic gain control to the adding circuit O with unity gain. The same signals are also applied with unity gain but in phase opposition to the second input of this adding circuit via the all-pass filter F1. As a result the corresponding output signal $V_o$ of this adding circuit is zero. High-frequency signals having an amplitude greater than the threshold value $V_D$ of the automatic gain control are transmitted by this gain control to the adding circuit with a strong attenuation. Hence the corresponding output signal of the adding circuit O substantially corresponds to the signal applied via the all-pass filter, so that these signals pass through the noise reduction circuit substantially without any attenuation.

To enable an advantageous threshold value $V_D$ to be chosen for the active gain control B1 the signal from the high-pass filter F2 may obviously be amplified by means of an amplifier A and, after passing through the automatic gain control, be correspondingly attenuated by means of an additional attenuator B2. It will further be clear that instead of unity gain in both branches another gain factor may be used. As essential requirement is that the gain factors of the two branches are equal for signals having a frequency in the upper frequency band and an amplitude smaller than the threshold value, so that the signals from the two branches when added together cancel one another.

According to the invention the all-pass filter has a transfer characteristic corresponding to $1 - p\tau/1 + p\tau$ and the high-pass filter has a transfer characteristic corresponding to:

$$(p\tau)^3/(p\tau+1)\ \{\ (p\tau)^2+p+1\ \}$$

Owing to the choice of these transfer characteristics the addition of the output signals from both branches the very advantageous overall transfer characteristics:

$$1 - p\tau/1 + p\tau + (p\tau)^3/(p\tau+1)\ \{\ (p\tau)^2+p\tau+1\ \}$$
$$= 1/(1+p\tau)\ \{\ (1+p\tau+(p\tau)^2\ \}$$

This is exactly the transfer function of a third-order low-pass filter having a Butterworth or maximum flatness characteristic in the pass band.

Besides this advantageous very flat transfer characteristic in the pass band the noise suppression circuit according to the invention has the advantage that at the same time the phase lead due to the correction networks provided in magnet tape recorders may be compensated for, resulting in a great improvement of the transient reproduction. These correction networks cause a phase lead of about 180° at high frequencies. However, the all-pass filter used in the noise reduction circuit according to the invention causes a phase lag of 180° at these high frequencies. Thus by ensuring that the signal splitter and the adding circuit do not produce any further phase shifts of the signal passed by the all-pass filter a compensation of the phase shift due to the correction networks of the magnetic tape recorder is obtained.

A possible embodiment of the noise reduction circuit according to the invention which is based on the block diagram of FIG. 3 is shown in FIG. 4.

The all-pass filter F1 is realized by means of a transistor circuit which comprises a transistor T1 having equal emitter and collector resistors R4 and R3 respectively and the series combination of a resistor R5 and a capacitor C2, which series combination shunts the collector emitter path of the transistor $T_{r1}$. The input signal $V_i$ is applied through a capacitor C1 to the base of the transistor $T_{r1}$, which base is suitably biassed by means of resistors R1 and R2, the output signal from the all-pass filter being taken from the junction point of the resistor R5 and the capacitance C2.

The transistor $T_{r1}$ also acts as the input stage of the noise reduction circuit. The signal to be applied to the high-pass filter is taken from the collector of the transistor $T_{r1}$.

This high-pass filter F2, which is to realize the aforementioned transfer characteristic, comprises the cascade arrangement of two RC high-pass filters and a third network provided with feedback. The desired transfer function may be written as follows:

$$\frac{(p\tau)^3}{(p\tau+1)\{(p\tau)^2+p\tau+1\}} = \frac{p\tau}{p\tau+1}\cdot\frac{p\tau}{p\tau+1}\cdot\frac{p\tau}{(p\tau+1)-\frac{p\tau}{p\tau+1}}$$

The last two terms are realized to a fairly satisfactory approximation by means of a transistor $T_{r2}$, resistors R8 to R11 and capacitors C3 and C4, connected as shown. The first term is realized by means of an RC network comprising a capacitor C5 and the input resistance of the amplifier A.

This amplifier is required to bring the level of the signal to a value suitable for the automatic gain control B1 following the amplifier. This gain control has two branches which each include a series combination of two diodes D1, D3 and D2, D4 respectively and together form an anti-parallel configuration. The junction points of the diodes D1, D3 and D2, D4 are connected through capacitors C8 and C9 respectively to a point of constant potential (earth). The series combinations of the diodes are shunted by a resistor R15 one end of which is connected through a capacitor C7 to the output of the amplifier A and the other end of which forms the output of the automatic gain control. The operation of this gain control is based on the resistance variation of a diode in accordance with the value of the current. The automatic gain control is effected by the diodes D3 and D4 together with the resistor R15, because for alternating current these diodes are connected in parallel to earth via the capacitors C8 and C9. The diodes D3 and D4 are fed with current via the diodes D1 and D2 respectively, for these diodes D1 and D2 together with the capacitors C8 and C9 form rectifiers.

The arrangement of the rectifier with its two branches in phase opposition is very advantageous, because any even-harmonic distortion of the signal is avoided in this manner. If the cross-over point of the high-pass filter F2 is selected to lie at from 4 to 5 kHz, which is a value which has been found suitable in practice, the third-harmonic distortion lies at the edge of the audio range and hence provides little trouble. This permits the capacitor C8 and C9 to have optimally small values in view of rapid set-in and release of the automatic gain control so that the transient reproduction remains satisfactory and the modulation noise remains a minimum.

When Si diodes are used the threshold value lies between 300 mV and 500mV. With reference to an input signal of the noise reduction circuit of the order of 1 volt at maximum drive the normal noise levels of the magnetic tape recorders from the non-professional sector are of the order of from 2 mV to 5 mV. At these noise levels the noise suppression circuit must start switching off, so that the amplifier A preceding the automatic gain control is required to provide matching of the threshold value of this automatic gain control to the desired threshold value for the input signal of the noise reduction circuit. This amplifier A is provided with a limiter (capacitor C6, diodes D5) to avoid asymmetric jamming and consequent second-harmonic distortion. However, this limiter must be proportioned so that it becomes operative only when the automatic gain control is appreciably driven for high-frequency signals.

The adding circuit simply comprises two resistors R6 and R16 which via a capacitor C10 are connected to the output terminal of the noise suppression circuit. The end of the resistor R6 not connected to the capacitor is connected to the output of the all-pass filter, and the end of the resistor R16 not connected to the capacitor is connected to the output of the automatic gain control. Obviously, here also the values of these resistors must be such that the amplitude of the high-frequency noise across these resistors is equal when the input signal of the noise reduction circuit contains no high-frequency signal.

It will be appreciated that the noise reduction circuit according to the invention is not restricted to the embodiment shown in FIG. 4. This embodiment only illustrates how a noise reduction circuit according to the invention may be realized in a comparatively simple manner with the use of simple components.

FIG. 5 shows the transfer function of the noise reduction circuit of FIG. 4 as a function of the level of the high-frequency signal. This graph clearly shows that at low levels of the high-frequency signal heavy damping is obtained, which rapidly decreases with increasing amplitude.

What is claimed is:

1. Noise reduction circuit which comprises an input stage having an input means for receiving the signal to be processed and which has a first and a second output, an all-pass filter having an input coupled to the first output of the input stage and an output, a high-pass filter having an input coupled to the second output of the input stage and an output, an automatic gain control stage having an input coupled to the output of the high-pass filter, an output, and a gain function which decreases above a given threshold value of a signal at said input, and an adding circuit having a first input coupled to the all-pass filter output, and a second input coupled to the output of the automatic gain control stage, whereby said adder has common signals at said inputs, said common signals which have amplitudes below the said threshold value being at least substantially equal in amplitude and opposite in phase, said all-pass filter having means for providing a transfer function which at least substantially corresponds to the function $1-p\tau/1+p\tau$ and the highpass filter having a means for providing a transfer function which at least substantially corresponds to the function $$(p\tau)^3/(p\tau+1)\ [(p\tau)^2+p\tau+1]$$

where p is the imaginary angular frequency and $\tau$ is a time constant.

2. Noise reduction circuit as claimed in claim 1, wherein the overall phase shift between the input and the output of the noise suppression circuit along the signal path which includes the all-pass filter is entirely determined by the transfer function of said all-pass filter.

3. Noise reduction circuit as claimed in claim 1 wherein said input stage and the all-pass filter together comprise a transistor having emitter, base, and collector electrodes, equal collector and emitter resistors coupled to said transistor, said base comprising said input means, a series combination of a resistor and a capacitor having a junction point and shunt coupled to said emitter and collector, said junction point comprising said output of the all-pass filter, the second output of the input stage comprising the collector of the transistor.

4. Noise reduction circuit as claimed in claim 1 wherein said automatic gain control stage having three parallel branches, whereby first and second junction points are formed, said first junction point comprising said control stage first input and said second junction point comprising said control stage output, the first and second branches each including the series combination of two diodes, which series combinations have opposed pass directions, the third branch including a resistor, and a pair of capacitors coupled between the junction points of the series-connected diodes in the first and second branches respectively and to a point of constant potential.

5. Noise reduction circuit as claimed in claim 1 wherein said high-pass filter comprises the cascade arrangement of two RC high-pass filters and of a third network provided with feedback.

6. Noise reduction circuit as claimed in claim 5, wherein said network provided with feedback comprises an RC high-pass filter, and an amplifier means of unity gain which has a high input impedance and a low output impedance for providing said feedback.

7. Noise reduction circuit as claimed in claim 1, further comprising an amplifier provided with a limiter coupled between the high-pass filter and the automatic gain control stage.

8. Noise reduction circuit as claimed in claim 5, further comprising, an amplifier having a limiter coupled between said high-pass filter and said gain control stage, said amplifier having an input impedance, one of RC sections comprising said input impedance.

* * * * *